METHOD OF DOPING EPITAXIALLY GROWN SEMICONDUCTOR MATERIAL
Filed Aug. 9, 1965
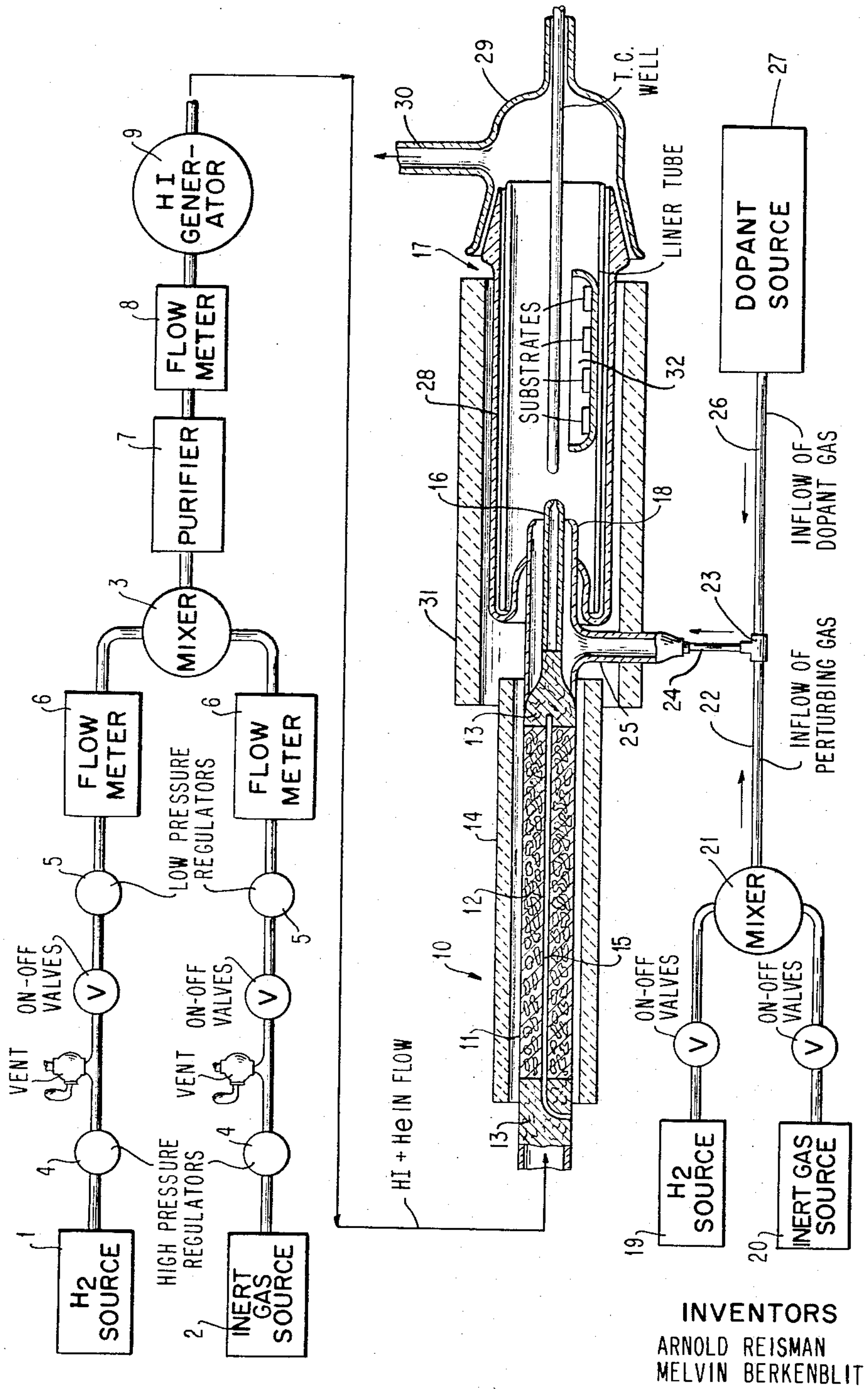
INVENTORS
ARNOLD REISMAN
MELVIN BERKENBLIT
BY
Thomas J. Kilgannon Jr.
ATTORNEY United States Patent Office 3,361,600
Patented Jan. 2, 1968

3,361,600

METHOD OF DOPING EPITAXIALLY GROWN SEMICONDUCTOR MATERIAL

Arnold Reisman and Melvin Berkenblit, Yorktown Heights, N.Y., assignors to International Business Machines Corporation, Armonk, N.Y., a corporation of New York Filed Aug. 9, 1965, Ser. No. 478,108
20 Claims. (Cl. 148—175)

This invention relates generally to a method of doping epitaxially grown semiconductor materials and more specifically relates to a method for simultaneously growing by epitaxy single crystals of semiconductor material and doping said crystals by the utilization of a perturbable disproportionation reaction in conjunction with a pyrolytic decomposition at a deposition region.

In the past, methods for doping single crystal semiconductor materials grown from the vapor phase using disproportionation reactions have been accomplished in one of the three following ways:

(i) Single crystal growth of a given conductivity type was attained utilizing a predoped source of semiconductor material in a single line reactor system.

(ii) Single crystal growth of a given conductivity type was attained utilizing a series arrangement of a semiconductor material, either doped or undoped, and a source of impurity in a single line reactor system.

(iii) Single crystal growth of a given conductivity type was attained utilizing parallel sources of semiconductor material and dopant in a double line reactor system.

All of the above mentioned systems have the disadvantage that competing reactions among the system constituents can be set up resulting in a reduction in the efficiency of deposition. Very often, it is difficult to vary dopant concentration and maintain reasonable growth rates because one of the disproportionation reactions overcomes the other. This occurs particularly where the dopant source consists of gallium or gallium and germanium.

Other methods for doping epitaxially grown materials such as a semiconductor tetrahalide reduction process have the disadvantage that the concentration of dopants in the semiconductor tetrahalide varies because of the difference in vapor pressure between the tetrahalide and the dopants utilized. Pyrolytic reactions which provide doped epitaxial films have the disadvantage that rather elaborate systems must be utilized to control the amount of dopant introduced from a separate source. Other parameters such as temperature are also subject to fine control in the pyrolytic decomposition method.

Since disproportionation reactions appear to provide the most desirable approach to the epitaxial deposition of semiconductor materials, a method for doping such epitaxially grown semiconductor materials also appears to be desirable particularly when it can be utilized in conjunction with the most efficient of such disproportionation reactions, i.e., a perturbable disproportionation reaction.

It is, therefore, an object of this invention to provide a method of doping epitaxially grown semiconductor material which is superior to prior art methods of doping.

Another object is to provide a method of doping epitaxially grown semiconductor materials without affecting the efficiency of the disproportionation reaction which produces the epitaxially grown material.

Another object is to provide a method of doping epitaxially grown semiconductor materials in which a disproportionation reaction and a pyrolytic decomposition occur simultaneously.

Another object is to provide a method of doping epitaxially grown semiconductor materials in which the dopant concentration can be varied.

Another object is to provide a method of doping epitaxially grown semiconductor materials with both $n$ and $p$ conductivity type impurities.

Another object is to provide a method of doping epitaxially grown semiconductor material in which the disproportionation reaction is not perturbed by the presence of trace amounts of dopants.

A feature of this invention is a method for doping epitaxially grown semiconductor material in a perturbable disproportionation system which includes the step of reacting germanium with a hydrogen, inert gas, halide mixture to produce a mixture of compounds of the elements in the vapor phase. Also included is the step of simultaneously adding a gaseous hydride dopant and a perturbing gas to the mixture to pyrolytically decompose the hydride, and to perturb the equilibrium vapor phase content of germanium in the mixture so that doped germanium is epitaxially deposited on a substrate.

Another feature is the method for doping epitaxially grown semiconductor material in a perturbable disproportionation system which includes the step of reacting germanium with a hydrogen, inert gas, halide mixture to produce a mixture of compounds of the elements in the vapor phase. Also included is the step of simultaneously adding a gaseous hydride dopant and a perturbing gas selected from the group consisting of hydrogen, and hydrogen and an inert gas to the mixture to pyrolytically decompose the gaseous hydride and perturb the equilibrium vapor phase content of germanium in the mixture such that doped germanium is epitaxially deposited on a substrate.

Another feature is a method for doping epitaxially grown semiconductor material in a perturbable disproportionation system which includes the step of reacting germanium with a hydrogen, inert gas halide mixture at a given temperature to produce compounds of the element in the vapor phase, the hydrogen and inert gas being present in a given mole fraction. Simultaneously with the foregoing step, a gaseous hydride dopant and at least one of the perturbing gases selected from the group consisting of hydrogen and hydrogen and an inert gas is added in a volume equal to the volume of the given mole fraction to pyrolytically decompose the gaseous hydride and perturb the equilibrium vapor phase content of germanium in the mixture whereby doped germanium is epitaxially deposited on a substrate.

Another feature is the method of doping which includes the steps of providing a source of germanium within a reaction tube at a given temperature and flowing a gaseous mixture consisting of hydrogen, a halide, and an inert gas over germanium to form a perturbable mixture at the given temperature. The perturbable mixture is then introduced into a dilution-deposition region of lower temperature than the initial temperature. The dilution-deposition region has a seed of semiconductor material disposed therein. Finally, a gaseous substance is introduced independently into the dilution-deposition region; a portion of which is adapted to perturb the equilibrium vapor phase content of germanium in the mixture and another portion of which is adapted to pyrolytically decompose to provide a dopant such that doped germanium is epitaxially deposited on a substrate.

Another feature is a method for doping epitaxially grown semiconductor material in a perturbable disproportionation system which utilizes the steps of reacting germanium with a hydrogen, inert gas, halide mixture at a given temperature to provide a mixture of compounds of said elements in the vapor phase, simultaneously adding to said mixture a gaseous hydride selected from the group consisting of phosphorous hydride, boron hydride and arsenic hydride, and at least one of the perturbing gases selected from the group consisting of hydrogen, and hydrogen and an inert gas at a temperature less than said given temperature to simultaneously perturb the equilibrium vapor phase content of germanium in said mixture and pyrolytically decompose said gaseous hydride whereby doped germanium is epitaxially deposited on a substrate.

The foregoing and other objects, features and advantages of the invention will be apparent from the following more particular description of a preferred embodiment of the invention as illustrated in the accompanying drawing.

In the drawing there is shown a partial block diagram of a perturbable disproportionation system which is adapted for use in the doping method of this invention.

In accordance with the invention the method taught herein utilizes the simultaneous occurrence of the perturbation of a perturbable disproportionation system and the decomposition of a system subject to pyrolysis to dope epitaxially deposited material. The disproportionation system provides an epitaxially deposited layer of semiconductive material while the system subject to pyrolysis provides the impurity dopants which are incorporated into the semiconductor during deposition. In epitaxial growth, the crystalline semiconductor material has a crystallographic orientation which is determined by the crystallographic orientation of a substrate upon which deposition is made. Any substrate material having therein a crystallographic plane which has a crystallographic plane having the same orientation and lattice constants as the layer to be deposited may be utilized provided growth takes place on a surface parallel to the crystallographic plane of the substrate.

The method of doping of the present invention has the advantage that it has no deleterious effect on the efficiency of deposition which results from the perturbation of a perturbable disproportionation reaction. A co-pending application entitled "Method for Enhancing Efficiency of Recovery of Semiconductor Material in Perturbable Disproportionation Systems" in the name of A. Reisman, M. Berkenblit and S. A. Alyanakyan and assigned to the same assignee as the present invention discloses a disproportionation system which can be utilized in the practice of the present invention. The apparatus utilized in the performance of the method of the co-pending application is readily adaptable to the method of the present invention permitting epitaxial growth of layers of different conductivity type as well as different values of resistivity in a given conductivity type material. Variations in conductivity type are obtained by utilizing pre-mixed tanks of a hydrogen-helium mixture or hydrogen alone, having different conductivity type determining impurities disposed therein. Also, variations in resistivity of a given conductivity type are obtainable by simply varying the flow rates of a diluent gas relative to the flow rates of the impurity containing gas.

In accordance with the invention, the method taught herein utilizes the perturbation of a disproportionation reaction to provide for highly efficient deposition of germanium on a substrate and a simultaneous pyrolytic decomposition of certain hydrides to provide doping of the germanium. The method includes broadly three independent steps. In the first step, a perturbable mixture is obtained by reacting germanium with a mixture of iodine, helium and hydrogen at a temperature of approximately 600° C. to form compounds of germanium in the vapor phase. At the 600° C. temperature, germanium di-iodide ($GeI_2$) is preferentially formed along with hydrogen iodide (HI) in a competing reaction, but successful results have been obtained over a temperature range of 550° C.–900° C. In the second step, $GeI_2$ and HI in the vapor phase is carried to a seed chamber where either hydrogen or a mixture of hydrogen and helium in varying volumes is introduced to perturb the reaction at a 350° C. temperature for example. The ratio of hydrogen to iodine is effectively increased and partial vapor pressure of iodine is reduced to 1 mm. of mercury where, for instance, it had previously been 2 mm. of mercury and epitaxial deposition takes place. In addition, another competing reaction between the hydrogen and the iodine is effectively produced. Since the equilibrium conditions for maintaining germanium di-iodide no longer exist at a temperature of 350° C., germanium tetra-iodide and germanium are formed and germanium in pure form is epitaxially deposited on a substrate at this temperature. Because of the competing reaction between hydrogen and iodine, it may be seen that by introducing more hydrogen, that is, in excess amounts, the effective partial vapor pressure of iodine can be reduced causing increasing amounts of germanium to be deposited.

In a third step and simultaneously with the second step, a mixture of hydrogen or hydrogen and helium and a suitable dopant in hydride form (arsenic, phosphorous, or boron hydride) is introduced into the seed chamber along with the above mentioned perturbing gas. At the temperature chosen, the hydride of the dopant undergoes pyrolytic decomposition and the dopant is deposited along with the germanium. Since the volume of the perturbing gas introduced into the seed chamber determines the efficiency of the recovery of germanium from the disproportionation reaction, care must be taken to insure that the sum of the volumes of the perturbing gases from all sources is equal to the amount required to obtain a desired efficiency.

Referring now to the drawing and considering only the deposition of germanium aspect, there is shown a perturbable disproportionation system which is utilized with the method of this invention. Gas sources 1, 2 provide hydrogen and an inert gas, respectively, which are delivered to a mixer 3 after passing through high and low pressure regulators 4 and 5, respectively, and flow meters 6. In connection with gas source 2, it should be appreciated that any inert gas such as argon, helium or nitrogen may be utilized without departing from the spirit of this invention. The hydrogen and inert gas mixture from mixer 3 is introduced into a purifier 7 where contaminants are removed. The output mixture from purifier 7 is monitored by flow meter 8 and passes to a hydrogen iodide generator 9 wherein a reaction between the hydrogen of the mixture and iodine in generator 9 produces hydrogen iodide; providing at the output of generator 9 a hydrogen, hydrogen iodide, helium mixture. Hydrogen and iodine can be introduced directly to a germanium source region, but the hydrogen iodide form is preferable because equilibirum conditions can be more easily achieved in the germanium source region. The hydrogen, hydrogen iodide, inert gas mixture is then introduced into a reaction chamber 10 consisting of a quartz tube 11 which contains a quantity of germanium 12. Germanium 12 is retained in fixed position within tube 11 by quartz wool plugs 13. Quartz tube 11 is shown disposed internally of furnace 14 which may be of appropriate type well known to those skilled in this art. A thermocouple well 15 disposed axially of tube 11 provides access for a thermocouple (not shown) which enables measurement of the temperature of germanium 12. A nozzle section 16 extending from tube 11 carries the reaction products from tube 11 into a dilution-deposition chamber 17 where the reaction products are diluted in a manner to be explained fully hereinafter. Nozzle section 16 is surrounded by a coaxial nozzle section 18 which extends into chamber 17 and carries a diluent gas which is fed from source of hydrogen 19 and inert gas 20 through mixer 21 to an arm 22 of a T-junction 23 which is connected by arm 24 to junction 25 which extends from nozzle section 18. Arm 26 of T-junction 23 is connected to a hydrogen, inert gas, dopant source 27 and will be discussed separately hereinafter when the doping step is considered. Dilution-deposition chamber 17 consists of a quartz tube 28 sealed about nozzle section 18 at one end thereof and having a removable section 29 at the other end thereof. An exhaust port 30 in section 29 permits the outflow of gases from the chamber 17. Chamber 17 is disposed internally of furnace 31 which is maintained at a lower temperature than furnace 14 is in accordance with the teaching of this invention. A quartz boat 32 is disposed internally of chamber 17 and is so positioned that germanium is deposited on substrates placed on the boat when the mixture of compounds resulting from the system reactions is perturbed.

The double flow disproportionation system as shown in the drawing increases the efficiency of deposition of germanium by introducing a diluent gas into dilution-deposition chamber 17 to perturb the mixture by vapor pressure reduction of one of the constituents of the mixture as well as by a reduction in temperature at the deposition region. Specifically, hydrogen from source 1 and helium from source 2 are mixed in mixer 3 to provide a desired $H_2/(H_2+He)$ fraction. After passing through HI generator 9, a hydrogen iodide (HI) plus helium (He) plus hydrogen ($H_2$) mixture results having a total pressure of one atmosphere. Thus, the sum of the partial pressures will be 760 mm. Hg.

$$p_{total}=760\text{ mm.}=p_{HI}+p_{H_2}+p_{He}$$

with the restriction that the partial pressure of hydrogen be at least equal to the partial pressure of iodine.

The hydrogen iodide, helium, hydrogen mixture is then introduced into reaction chamber 10 where, in passing through quartz tube 11, a reaction between germanium 12 and the hydrogen iodide takes place at a temperature of 600° C., for example. A competing reaction for germanium between hydrogen and iodine occurs resulting in the formation of germanium di-iodide ($GeI_2$) along with other reaction products. The formation of the di-iodide at the 600° C. temperature is a preferred reaction under the equilibrium conditions existing at that temperature. The reaction products exit from chamber 10 through nozzle section 16 and enter chamber 17 which is held at a temperature of 350° C., for example. At this point, without further action, a temperature controlled disproportionation reaction would take place and germanium would be deposited on substrates in boat 32 and efficiencies having a maximum of 25% would be obtainable. To improve the efficiency of deposition of germanium, the step of perturbing the equilibrium vapor phase content of germanium in the mixture in chamber 17 by introducing a diluent gas is taken. In a preferred step, the diluent gas takes the form of pure hydrogen introduced from source 19 in volumes greater than the volume of $H_2/(H_2+He)$ fraction initially introduced into reaction chamber 10. This step provides the greatest efficiency improvement. Hydrogen in volumes equal to the volume of the fraction initially introduced provides enhanced efficiencies which, while not as great as those provided by introducing excess amounts of hydrogen, are substantially greater than those obtained in single flow perturbable systems. Further, experiments have shown that efficiency can be increased over that provided by prior art systems by introducing a diluent gas of the same fraction $H_2/(H_2+He)$ and volume as initially introduced into the system.

The mechanism which provides the increased efficiency of germanium deposition depends, under the double flow conditions, both on temperature and on perturbation of the equilibrium vapor phase content of germanium in the mixture. Remembering that germanium di-iodide was preferably formed in reaction chamber 10 by flowing hydrogen, hydrogen iodide, helium mixture over germanium at approximately 600° C., one would expect to obtain efficiencies up to 25% by simply passing the vapor phase mixture to a lower temperature environment. The introduction of a perturbing gas into dilution-deposition chamber 17 results in an increase in efficiency because the gaseous mixture at the deposition site is rendered oversaturated with respect to germanium due to the effective reduction of gas phase iodine content per liter of gas. By introducing a diluent gas into the dilution-deposition chamber 17, the vapor pressure of iodine is reduced, where, for instance its vapor pressure was 2 mm. upon introduction into reaction chamber 10, it is reduced to a vapor pressure of 1 mm. in dilution-deposition chamber 17. Under these circumstances, the equilibrium conditions for maintaining germanium and iodine in the di-iodide ($GeI_2$) form are no longer present and the following reaction causing deposition of germanium takes place at 350° C.

$$2GeI_2(g)\leftrightarrows GeI_4(g)+Ge(s)$$

The co-pending application referred to above shows that the efficiency of deposition of germanium can be increased from values of 25% to values up to 89% by introducing hydrogen alone or hydrogen-helium mixtures in volumes ranging from the same volume as introduced at the source to volumes in excess of those introduced at the source.

Considering now, the effect of introducing a doped gas from source 27 into the dilution-deposition chamber 17 by way of arm 26 of T-junction 23, it should be appreciated that the volume of doped gas must be adjusted so that it has no adverse effect on the efficiency of drop-out of germanium from the disproportionation reaction. Since the concentration of impurity dopant in source 27 is fixed, the concentration may be varied by adjusting both the flow of perturbing gas and the flow of dopant gas. Doping maybe carried out under conditions of very small flow rates relative to the flow of perturbing gas which is made substantially equal ot the flow of gas over germanium 12. In this manner, the dopant flow has no adverse effects on the perturbation reaction. Strictly speaking, however, as has been indicated above, there is no reason why relatively large flow rates from the dopant source 27 cannot be tolerated as long as the sum total of perturbing gas falls within the limits prescribed for efficient disproportionation reactions.

Referring again to the drawing, source 27 may be a hydrogen-dopant mixture or a hydrogen-helium-dopant mixture having a given concentration of dopant therein. Source 27 like sources 19 and 29, delivers gas to the system at substantially room temperature. The doped gas from source 27 is a hydride of arsenic, phosphorous, or boron otherwise known as arsine, phosphine and diborane, respectively. Boron is an acceptor impurity while the others are donor impurities. The acceptor impurities render a semiconductor of p-type conductivity while the donor impurities render it of n-type conductivity. The hydrides mentioned above are commercially available in tanks diluted with either hydrogen or hydrogen and helium. Concentrations of a desired impurity of 25 parts per million. for example, are obtainable commercially. Other acceptor impurities such as aluminum, gallium, antimony and indium could also be utilized in gaseous hydride form, but they are not presently commercially available in this form.

As has been mentioned above, the doping of the epitaxially deposited layer results from a pyrolysis of a desired hydride. The hydrides decompose at the temperature at which the disproportionation reaction occurs. A typical reaction using boron hydride (diborane) is:

$$B_2H_6\rightleftharpoons 2B+3H_2$$

In this dilution-deposition chamber 17, the boron or other suitable dopant is deposited on a suitable substrate which may be of germanium or gallium arsenide semiconductor material.

The doping of germanium with boron is accomplished in the following way. A given $H_2/(H_2+He)$ fraction is introduced into reaction chamber 10 at 75 cc./mm. flow rate where germanium is picked up at a desired temperature. A temperature range of 550° C.–900° C. is typical. The resulting mixture of hydrogen, helium, iodine and germanium is ultimately delivered to dilution-deposition chamber 17 via nozzle 16. A $H_2/(H_2+He)$ fraction from source 19, 20 of the same fraction as initially introduced into chamber 10 is delivered via arm 22 of T-section 23 and coaxial nozzle 18 to dilution-deposition chamber 17. Where a disproportionation reaction alone is desired, a flow rate equal to the flow rate through chamber 10 would be utilized since, as shown in the above mentioned co-pending application, this is one of the conditions for attaining enhanced deposition efficiency. Where a dopant is to be introduced, a given volume of the same $H_2/(H_2+He)$ fraction containing dopant in trace amounts is introduced into chamber 17 via arms 24, 26 of T-junction 23 and coaxial nozzle 18. For purposes of this example, assume that a 1 cc./min. flow rate of dopant from source 27 is utilized. For the conditions of flow equal to the flow from reaction chamber 10, 74 cc./min. would be required from sources 19, 20. If, for instance, the concentration of dopant in source 27 were 50 parts/million, the concentration of dopant at the dilution-deposition chamber 17 would be 25 parts/million. Actually, for dopant flow rates of 1 cc./min., much higher impurity concentrations would be required in order to produce epitaxially deposited germanium having useful resistivities.

From the foregoing, it should be clear, that a contribution to the volume of perturbing gas is made from source 27 and where flow conditions greater than equal flow conditions from sources 19, 20 are desired, excess hydrogen, for instance, may be contributed by source 27. It should also be clear, that by adjusting the flow rate of source 26 that the impurity concentration and consequently the resistivity of the deposited germanium can be changed. The change in volume due to the change in flow rate, however, should be compensated for by an increase in flow rate from sources 19, 20 where conditions of equal flow are desired.

Experimental results utilizing arsine as a dopant have indicated that it is possible to obtain impurity concentration of $4–5\times10^{18}$ atom/cc. in germanium utilizing equal volumes of 80% He and 20% $H_2$ through germanium 12 and from hydrogen, helium sources 19, 20, respectively and a dopant source 27. The flow rates were 75 cc./min., 74 cc./min. and 1 cc./min., respectively. The dopant contained 1425 p.p.m. of $AsH_3$ and after deposition resulted in a doped germanium crystal having $4–5\times10^{18}$ atoms/cc. of impurity.

In another experiment, under the same conditions, the impurity concentration was reduced to 1250 p.p.m. and a crystal of germanium containing $1\times10^{18}$ atom/cc. of impurity resulted.

From the foregoing, therefore, it may be seen that a method for doping epitaxially grown germanium is provided which can be undertaken with no reduction in the efficiency of deposition, can be accurately controlled and can provide variation in the concentration of dopant in germanium.

While the invention has been particularly described with reference to specific examples thereof, it will be understood by those skilled in the art that various changes in procedure may be made therein without departing from the spirit and scope of the invention.

What is claimed is:

1. A method for doping eptiaxially grown semiconductor material in a perturbable disproportionation system comprising the steps of reacting germanium with a hydrogen, inert gas, halide mixture to produce a mixture of compounds of said elements in the vapor phase and simultaneously adding a gaseous hydride dopant and a perturbing gas to said mixture to pyrolytically decompose said gaseous hydride and to perturb the equilibrium vapor phase content of germanium in said mixture whereby doped germanium is epitaxially deposited on a substrate.

2. A method for doping epitaxially grown semiconductor material in a perturbable disproportionation system comprising the steps of reacting germanium with a hydrogen, inert gas, halide mixture at a given temperature to produce a mixture of compounds of said elements in the vapor phase and simultaneously adding a gaseous hydride dopant and a perturbing gas to said mixture at a temperature lower than said given temperature to pyrolytically decompose said gaseous hydride and perturb the equilibrium vapor phase content of germanium in said mixture whereby doped germanium is epitaxially deposited on a substrate.

3. A method for doping epitaxially grown semiconductor material in a perturbable disproportionation system comprising the steps of reacting germanium with a hydrogen, helium iodine mixture to produce a mixture of compounds of said elements in the vapor phase and simultaneously adding a gaseous hydride dopant and a perturbing gas to said mixture to pyrolytically decompose said gaseous hydride and perturb the equilibrium vapor phase content of germanium in said mixture whereby doped germaninum is epitaxially deposited on a substrate.

4. A method for doping epitaxially grown semiconductor material in a perturbable disproportionation system comprising the steps of reacting germanium with a hydrogen, inert gas, halide mixture to produce a mixture of compounds of said elements in the vapor phase and simultaneously adding a gaseous hydride dopant and a perturbing gas selected from the group consisting of hydrogen, and hydrogen and an inert gas to said mixture to pyrolytically decompose said gaseous hydride and perturb the equilbrium vapor phase content of germanium in said mixture whereby doped germanium is epitaxially deposited on a substrate.

5. A method for doping epitaxially grown semiconductor material in a perturbable disproportionation system comprising the steps of reacting germanium with a hydrogen, inert gas, halide mixture at a given temperature to produce a mixture of compounds of said elements in the vapor phase and simultaneously adding a gaseous hydride dopant and a perturbing gas selected from the group consisting of hydrogen, and hydrogen and helium to said mixture at a temperature lower than said given temperature to pyrolytically decompose said gaseous hydride and perturb the equilibrium vapor phase content of germanium in said mixture whereby doped germanium is epitaxially deposited on a substrate.

6. A method for doping epitaxially grown semiconductor material in a perturbable disproportionation system comprising the steps of reacting germanium with a hydrogen, helium, iodine mixture at a given temperature to produce a mixture of compounds of said elements in the vapor phase and simultaneously adding a gaseous hydride dopant and a perturbing gas selected from the group consisting of hydrogen and hydrogen and helium to said mixture at a temperature lower than said given temperature to pyrolytically decompose said gaseous hydride and perturb the equilibrium vapor phase content of germanium in said mixture whereby doped germanium is epitaxially deposited on a substrate.

7. A method for doping epitaxially grown semiconductor material in a perturbable disproportionation system comprising the steps of reacting germanium with hydrogen, helium, iodine mixture at a given temperature to produce a mixture of compounds of said elements in the vapor phase and simultaneously adding a gaseous hydride dopant and a perturbing gas consisting of hydrogen to said mixture at a temperature lower than said given temperature to pyrolytically decompose said gaseous hydride and perturb the equilibrium vapor phase content of germanium in said mixture whereby doped germanium is epitaxially deposited on a substrate.

8. A method for doping epitaxially grown semiconductor material in a perturbable disproportionation system comprising the steps of reacting germanium with hydrogen, helium, iodine mixture at a given temperature to produce a mixture of compounds of said elements in the vapor phase and simultaneously adding a gaseous hydride dopant and a perturbing gas consisting of hydrogen and helium to said mixture at a temperature lower than said given temperature to pyrolytically decompose said gaseous hydride and perturb the equilibrium vapor phase content of germanium in said mixture whereby doped germanium is epitaxially deposited on a substrate.

9. A method for doping epitaxially grown semiconductor material in a perturbable disproportionation system comprising the steps of reacting germanium with a hydrogen, inert gas, halide mixture at a given temperature to produce compounds of said elements in the vapor phase, said hydrogen and inert gas being present in a given mole fraction and simultaneously adding a gaseous hydride dopant and at least one of the perturbing gases selected from the group consisting of hydrogen, and hydrogen and an inert gas in a volume equal to the volume of said given mole fraction to pyrolytically decompose said gaseous hydride and perturb the equilibrium vapor phase content of germanium in said mixture whereby doped germanium is epitaxially deposited on a substrate.

10. A method for doping epitaxially grown semiconductor material in a perturbable disproportionation system comprising the steps of reacting germanium with a hydrogen, inert gas, halide mixture at a given temperature, to produce compounds of said elements in the vapor phase, said hydrogen and inert gas being present in a given mole fraction and simultaneously adding a gaseous hydride dopant and perturbing gas consisting of hydrogen in at least the same volume as said given mole fraction to pyrolytically decompose said gaseous hydride and perturb the equilibrium vapor phase content of germanium in said mixture whereby doped germanium is epitaxially deposited on a substrate.

11. A method for doping epitaxially grown semiconductor material in a perturbable disproportionation system comprising the steps of reacting germanium with a hydrogen, inert gas, halide mixture at a given temperature to produce compounds of said elements in the vapor phase, said hydrogen and inert gas being present in a given mole fraction and simultaneously adding a gaseous hydride dopant and a perturbing gas consisting of hydrogen in excess of the volume of said given mole fraction to pyrolytically decompose said gaseous hydride and perturb the equilibrium vapor phase content of germanium in said mixture whereby doped germanium is epitaxially deposited on a substrate.

12. A method for doping epitaxially grown semiconductor material in a perturbable disproportionation system comprising the steps of reacting germanium with a hydrogen, inert gas, halide mixture at a given temperature to produce a mixture of compounds of said elements in the vapor phase, and simultaneously adding to said mixture a gaseous hydride selected from the group consisting of phosphorous hydride, boron hydride, and arsenic hydride, and at least one of the perturbing gases selected from the group consisting of hydrogen and hydrogen and an inert gas at a temperature less than said given temperature to simultaneously perturb the equilibrium vapor phase content of germanium in said mixture and pyrolytically decompose said gaseous hydride whereby doped germanium is epitaxially deposited on a substrate.

13. A method for doping epitaxially grown semiconductor material in a perturbable disproportionation system comprising the steps of providing a source of germanium within a reaction tube at a given temperature, flowing a gaseous mixture consisting of hydrogen, a halide and an inert gas over said germanium to react said germanium with said hydrogen and said halide to form a perturbable mixture at said given temperature, introducing said perturbable mixture into a dilution-deposition region of temperature lower than said given temperature and having a seed of semiconductor material disposed therein, and introducing independently into said dilution-deposition region a gaseous substance a portion of which is adapted to perturb the equilibrium vapor phase content of germanium in said mixture, another portion of which is adapted to pyrolytically decompose to provide a dopant such that doped germanium is epitaxially deposited on a substrate.

14. A method for doping epitaxially grown semiconductor material in a perturbable disproportionation system comprising the steps of providing a source of germanium within a reaction tube at a given temperature, flowing a gaseous mixture consisting of a hydrgen, helium and iodine over said germanium to react said germanium with said hydrogen and said iodine to form a perturbable mixture at said given temperature, introducing said perturbable mixture into a dilution-deposition region of temperature lower than said given temperature and having a seed of semiconductor material disposed therein and introducing independently into said dilution-deposition region a mixture of a gaseous hydride and hydrogen and helium to perturb the equilibrium vapor phase content of germanium in said mixture, and to pyrolytically decompose said gaseous hydride to provide a dopant whereby doped germanium is epitaxially deposited on a substrate.

15. A method for doping epitaxially grown semiconductor material in a perturbable disproportionation system comprising the steps of providing a source of germanium with a reaction tube at a given temperature, flowing a gaseous mixture consisting of hydrogen, helium and iodine over said germanium to react said germanium with said hydrogen and said iodine to form a perturbable mixture at said given temperature, introducing said perturbable mixture into a dilution-deposition region of temperature lower than said given temperature and having a seed of semiconductor material disposed therein and introducing independently into said dilution-deposition region in a mixture of a gaseous hydride and hydrogen to perturb the equilibrium vapor phase content of germanium in said mixture, and to pyrolytically decompose said gaseous hydride to provide a dopant whereby doped germanium is epitaxially deposited on a substrate.

16. A method for doping epitaxially grown semiconductor material in a perturbable disproportionation system comprising the steps of providing a source of germanium within a reaction tube over a temperature range of 550° C.–900° C., flowing a gaseous mixture consisting of a hydrogen, helium and iodine over said germanium to react said germanium with said hydrogen and iodine to form a perturbable mixture over said given temperature range, introducing said perturbable mixture into a dilution-deposition region at a temperature of 350° C. and having a seed of semiconductor material disposed therein and introducing independently into said dilution-deposition region a mixture of a gaseous hydride and hydrogen and helium to perturb the equilibrium vapor phase content of germanium in said mixture and pyrolytically decompose said gaseous hydride to provide a dopant whereby doped germanium is epitaxially deposited on a substrate.

17. A method for doping epitaxially grown semiconductor material in a perturbable disproportionation system comprising the steps of providing a source of germanium within a reaction tube over a temperature range of 550°–900° C., flowing a gaseous mixture consisting of hydrogen, helium and iodine over said germanium to react said germanium with said hydrogen and said iodine to form a perturbable mixture over said temperature range, introducing said perturbable mixture into a dilution-deposition region at a temperature of 350° C. and having a seed of semiconductor material disposed therein and introducing independently into said dilution-deposition region a mixture of a gaseous hydride and hydrogen to perturb the equilibrium vapor phase content of germanium in said mixture and to pyrolytically decompose said gaseous hydride to provide a dopant whereby doped germanium is epitaxially deposited on a substrate.

18. A method for doping epitaxially grown semiconductor material in a perturbable disproportionation system comprising the steps of providing a source of germanium within a reaction tube over a temperature range of 550°–900° C., flowing a gaseous mixture consisting of a hydrogen, helium and iodine over said germanium to react said germanium with said hydrogen and said iodine to form a perturbable mixture over said temperature range, introducing said perturbable mixture into a dilution-deposition region at a temperature of 350° C. and having a seed of semiconductor material disposed therein and introducing independently into said dilution-deposition region a mixture of a gaseous hydride, selected from the group consisting of phosphorous hydride, boron hydride and arsenic hydride to perturb the equilibrium vapor phase content of germanium in said mixture and to pyrolytically decompose said gaseous hydride to provide a dopant whereby doped germanium is epitaxially deposited on a substrate.

19. A method for doping epitaxially grown semiconductor material in a perturbable disproportionation system comprising the steps of introducing a semiconductor halide compound in the vapor phase which is capable of disproportionating at a deposition site and simultaneously adding a dopant gas and a perturbing gas to said compound to pyrolytically decompose said dopant and to perturb the equilibrium vapor phase content of germanium of said compound whereby doped germanium is epitaxially deposited on a substrate.

20. A method for doping epitaxially grown semiconductor material in a perturbable disproportionation sysem comprising the steps of introducing a germanium halide compound in the vapor phase which is capable of disproportionating at a deposition site at a given temperature and simultaneously adding a dopant gas and a perturbing gas to said compound at a temperature lower than said given temperature to pyrolytically decompose said dopant and to perturb the equilibrium vapor phase content of germanium of said compound whereby doped germanium is epitaxially deposited on a substrate.

References Cited

UNITED STATES PATENTS

| | | | |
|---|---|---|---|
| 3,089,788 | 5/1963 | Marinace | 148—175 |
| 3,096,209 | 7/1963 | Ingham | 117—106 |
| 3,152,932 | 10/1964 | Matovich | 117—200 |
| 3,192,083 | 6/1965 | Sirtl | 148—174 |
| 3,224,912 | 12/1965 | Ruehrwein | 148—175 |

DAVID L. RECK, *Primary Examiner.*

N. F. MARKVA, *Assistant Examiner.*